(12) United States Patent
Yang et al.

(10) Patent No.: US 12,433,035 B1
(45) Date of Patent: Sep. 30, 2025

(54) BI-DIRECTIONAL SEMICONDUCTOR-CONTROLLED RECTIFIER WITH DUAL-LEVEL ISOLATION STRUCTURES AND METHOD

(71) Applicant: GlobalFoundries Singapore Pte. Ltd., Singapore (SG)

(72) Inventors: Ting Yang, Singapore (SG); Jie Zeng, Singapore (SG); Kyong Jin Hwang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/814,958

(22) Filed: Aug. 26, 2024

(51) Int. Cl.
*H10D 62/815* (2025.01)
*H10D 89/60* (2025.01)

(52) U.S. Cl.
CPC ......... *H10D 89/713* (2025.01); *H10D 62/815* (2025.01)

(58) Field of Classification Search
CPC . H01L 27/0262; H10D 89/173; H10D 62/815
See application file for complete search history.

(56) References Cited

U.S. PATENT DOCUMENTS

| | | |
|---|---|---|
| 6,207,532 B1 | 3/2001 | Lin et al. |
| 9,570,465 B2 | 2/2017 | Vinet et al. |
| 2018/0323187 A1 | 11/2018 | Moen et al. |
| 2019/0305081 A1 * | 10/2019 | LaJoie ............... H01L 21/0228 |
| 2021/0242306 A1 * | 8/2021 | Mishra ................ H10D 62/116 |
| 2023/0059226 A1 * | 2/2023 | Mun ................ H01L 21/02236 |

OTHER PUBLICATIONS

Anonymous, "Box Isolation Technique," Electronic Materials-Script, p. 1, retrieved from: https://www.tf.uni-kiel.de/matwis/amat/semitech_en/kap_6/advanced/t6_1_2.html on Jul. 25, 2024.
Hong et al., "A Novel T-Shaped Shallow Trench Isolation Technology Using Sidewall Spacer for 512Mbit Flash Memories and Beyond," Extended Abstracts of the 2000 International Conference on Solid State Devices and Materials, Sendai, Aug. 2000, pp. 54-55.
Vashchenko et al., "Multi-Port ESD Protection Using Bi-Directional SCR Structures," 2003 IEEE BCTM, 4 pages.

* cited by examiner

*Primary Examiner* — Mohammad M Choudhry
(74) *Attorney, Agent, or Firm* — Francois Pagette; Hoffman Warnick LLC

(57) ABSTRACT

Disclosed is a semiconductor structure including a device (e.g., a bi-directional semiconductor-controlled rectifier, such as a bi-directional silicon-controlled rectifier (BD-SCR)) and, within the device, at least two dual-level isolation structures. Each dual-level isolation structure includes a first section at the top surface of the semiconductor substrate and one or more second sections extending through the first section deeper into the semiconductor substrate. The dual-level isolation structures are positioned within the device so as to increase well resistance. By increasing well resistance, the trigger voltage of the device can be reduced without increasing device size. Also disclosed is a method of forming dual-level isolation structures within such a device.

20 Claims, 12 Drawing Sheets

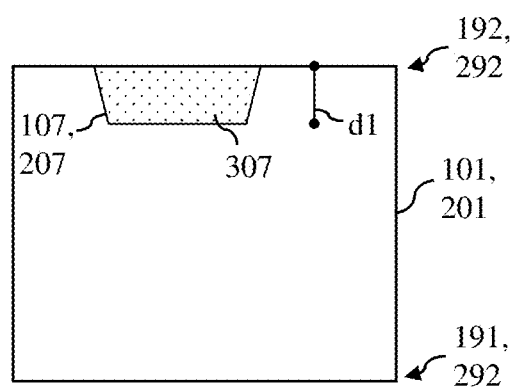
FIG. 5.1
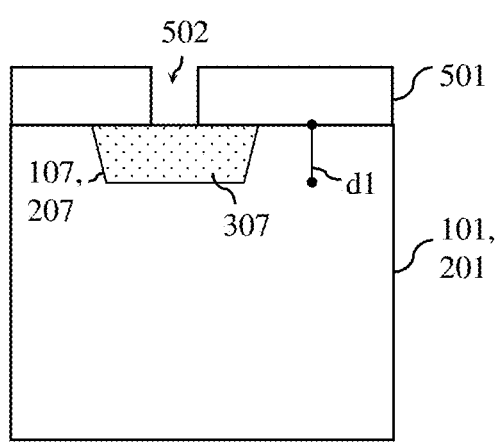
FIG. 5.2
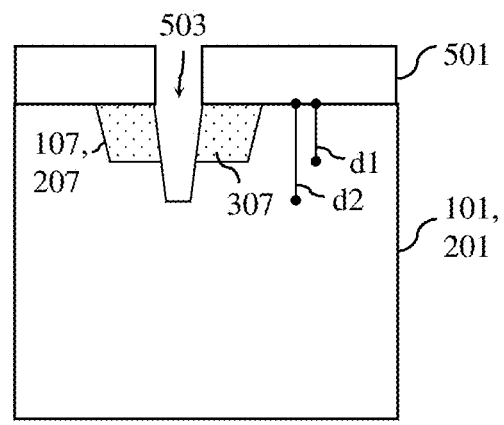
FIG. 5.3

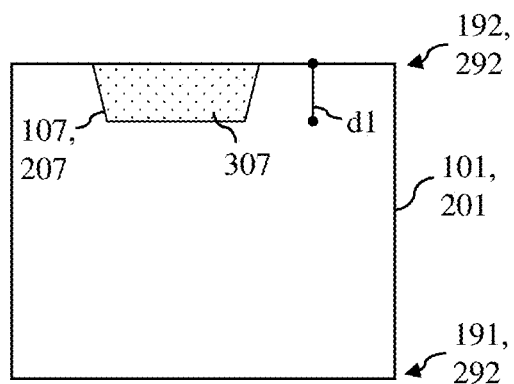
FIG. 6.1
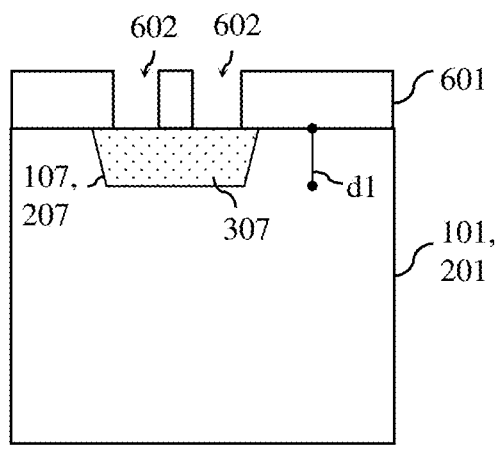
FIG. 6.2
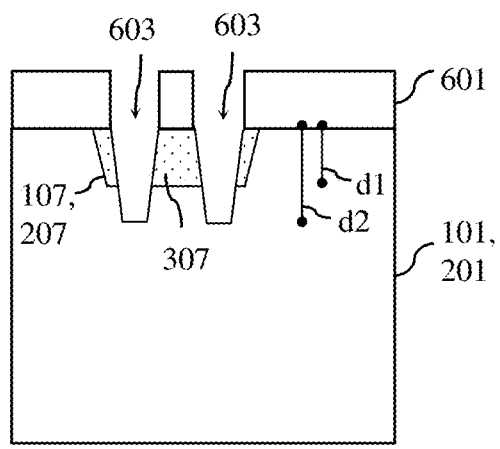
FIG. 6.3

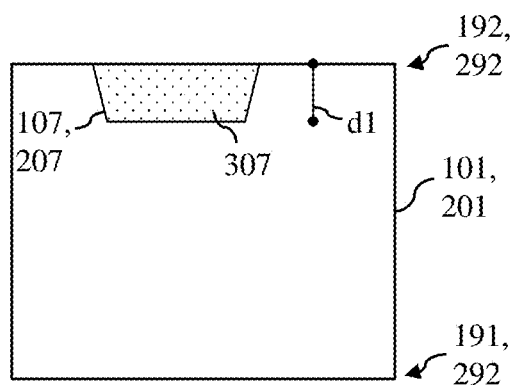
FIG. 7.1
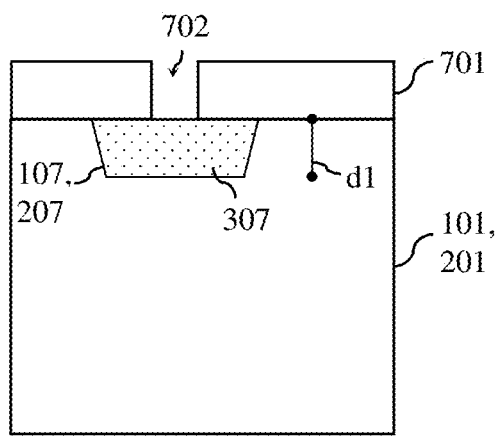
FIG. 7.2
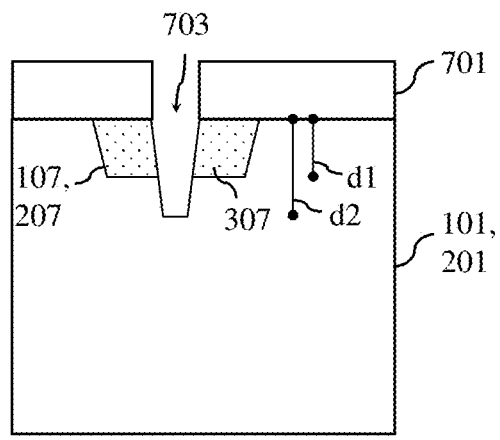
FIG. 7.3
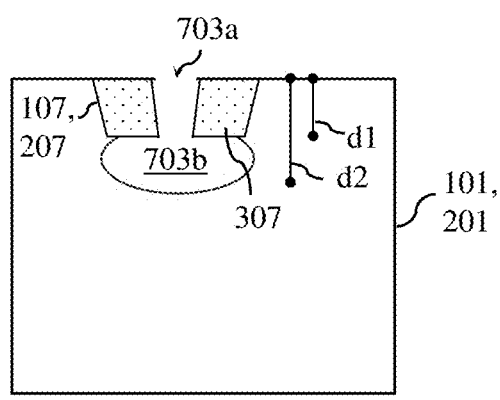
FIG. 7.4

BI-DIRECTIONAL SEMICONDUCTOR-CONTROLLED RECTIFIER WITH DUAL-LEVEL ISOLATION STRUCTURES AND METHOD

BACKGROUND

The present invention relates to electrostatic discharge (ESD) protection devices and, more particularly, to embodiments of semiconductor structure including a bi-directional semiconductor-controlled rectifier (e.g., a bi-directional silicon-controlled rectifier (BDSCR)) and method of forming the semiconductor structure.

Electrostatic discharge (ESD) events can negatively impact integrated circuit (IC) reliability. IC designs typically include ESD protection devices (e.g., at input/output pads, at power pads and between power domains). Such ESD protection devices include, but are not limited to, diodes, transistors, and semiconductor-controlled rectifiers (e.g., silicon-controlled rectifiers (SCRs)). Recently, bi-directional semiconductor-controlled (e.g., bi-directional silicon-controlled rectifiers (BDSCRs)) have been developed for use as ESD protection devices. However, the trigger voltage of these BDSCRs may be too high to provide effective ESD protection.

SUMMARY

Disclosed herein are embodiments of a semiconductor structure. The semiconductor structure can include a semiconductor substrate having a surface (also referred to herein as a top surface). The semiconductor structure can further a device in the semiconductor substrate. The device can include multiple wells including: two first wells adjacent to the top surface and having a first type conductivity; and a second well adjacent to the top surface, positioned laterally between the first wells, and having a second type conductivity that is different from the first type conductivity. The semiconductor structure can further include at least two dual-level isolation structures within the device. Each dual-level isolation structure can have a first section extending into the semiconductor substrate from the top surface to a first depth and at least one second section extending through the first section and into the semiconductor substrate to a second depth that is deeper than the first depth.

In some embodiments, the semiconductor structure can include a semiconductor substrate having a surface (also referred to herein as a top surface). The semiconductor structure can further include a device in the semiconductor substrate. The device can include multiple wells including: two first wells adjacent to the top surface and having a first type conductivity; and a second well adjacent to the top surface, positioned laterally between the first wells, and having a second type conductivity that is different from the first type conductivity. The device can further include, adjacent each first well at the top surface, a first contact region with the first type conductivity and a second contact region with the second type conductivity. The semiconductor substrate can further include at least two dual-level isolation structures within the device. Each dual-level isolation structure can have a first section extending into the semiconductor substrate from the top surface to a first depth and at least one second section extending through the first section and into the semiconductor substrate to a second depth that is deeper than the first depth. The dual-level isolation structures can include at two first dual-level isolation structures within the two first wells, respectively, each positioned laterally between the first contact region and the second contact region of a corresponding first well.

Also disclosed herein are embodiments of a method for forming the above described semiconductor structures. Specifically, the method can include providing a semiconductor substrate and forming, within the semiconductor substrate, a device and at least two dual-level isolation structures within the device. The semiconductor substrate can have a surface (also referred to herein as a top surface). The device can include multiple wells including: two first wells adjacent to the top surface and having a first type conductivity; and a second well adjacent to the top surface, positioned laterally between the first wells, and having a second type conductivity. Each dual-level isolation structure can have a first section extending a into the semiconductor substrate from the top surface to a first depth and at least one second section extending through the first section and into the semiconductor substrate to a second depth that is deeper than the first depth.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present invention will be better understood from the following detailed description with reference to the drawings, which are not necessarily drawn to scale and in which:

FIGS. 5.1-5.3 are cross-section diagrams illustrating partially completed DLI structures, respectively, being formed with the DLI structure configurations shown in FIG. 3A or 3D;

FIGS. 6.1-6.3 are cross-section diagrams illustrating partially completed DLI structures, respectively, being formed with the DLI structure configurations shown in FIG. 3B or 3E;

FIGS. 7.1-7.4 are cross-section diagrams illustrating partially completed DLI structures, respectively, being formed with the DLI structure configurations shown in FIG. 3C or 3F.

DETAILED DESCRIPTION

As mentioned above, electrostatic discharge (ESD) events can negatively impact integrated circuit (IC) reliability. IC designs typically include ESD protection devices (e.g., at input/output pads, at power pads and between power domains). Such ESD protection devices include, but are not limited to, diodes, transistors, and semiconductor-controlled rectifiers (e.g., silicon-controlled rectifiers (SCRs)). Recently, bi-directional semiconductor-controlled (e.g., bi-directional silicon-controlled rectifiers (BDSCRs)) have been developed for use as ESD protection devices. Recently, bi-directional semiconductor-controlled (e.g., bi-directional silicon-controlled rectifiers (BDSCRs)) have been developed for use as ESD protection devices. However, the trigger voltage of these BDSCRs may be too high to provide effective ESD protection.

In view of the foregoing, disclosed herein are embodiments of a semiconductor structure including a device (e.g., a bi-directional semiconductor-controlled rectifier, such as a bi-directional silicon-controlled rectifier (BDSCR)) and, within the device, at least two dual-level isolation structures. Each dual-level isolation structure can include a first section at the top surface of the semiconductor substrate and one or more second sections extending through the first section deeper into the semiconductor substrate. Various alternative configurations for the dual-level isolation structures are also disclosed. In any case, the dual-level isolation structures can be positioned symmetrically within the device so as to increase well resistance in both directions. By increasing well resistance in this manner, the trigger voltage of the device can be reduced (e.g., without increasing device size). Also disclosed herein are embodiments of a method of forming dual-level isolation structures within such a device.

Figure 1A:
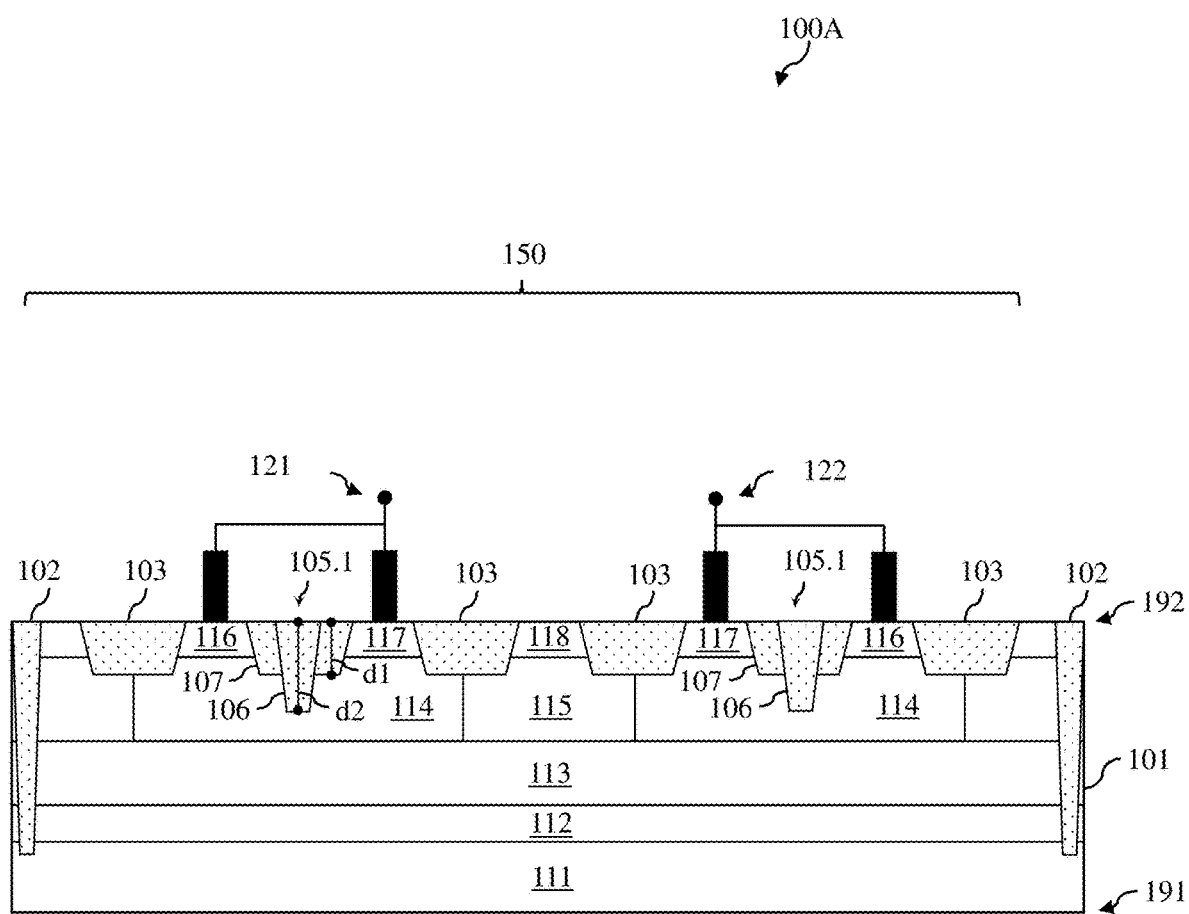
FIGS. 1A-1C are cross-section diagrams illustrating embodiments of a disclosed semiconductor structure, respectively.
Figure 1B:
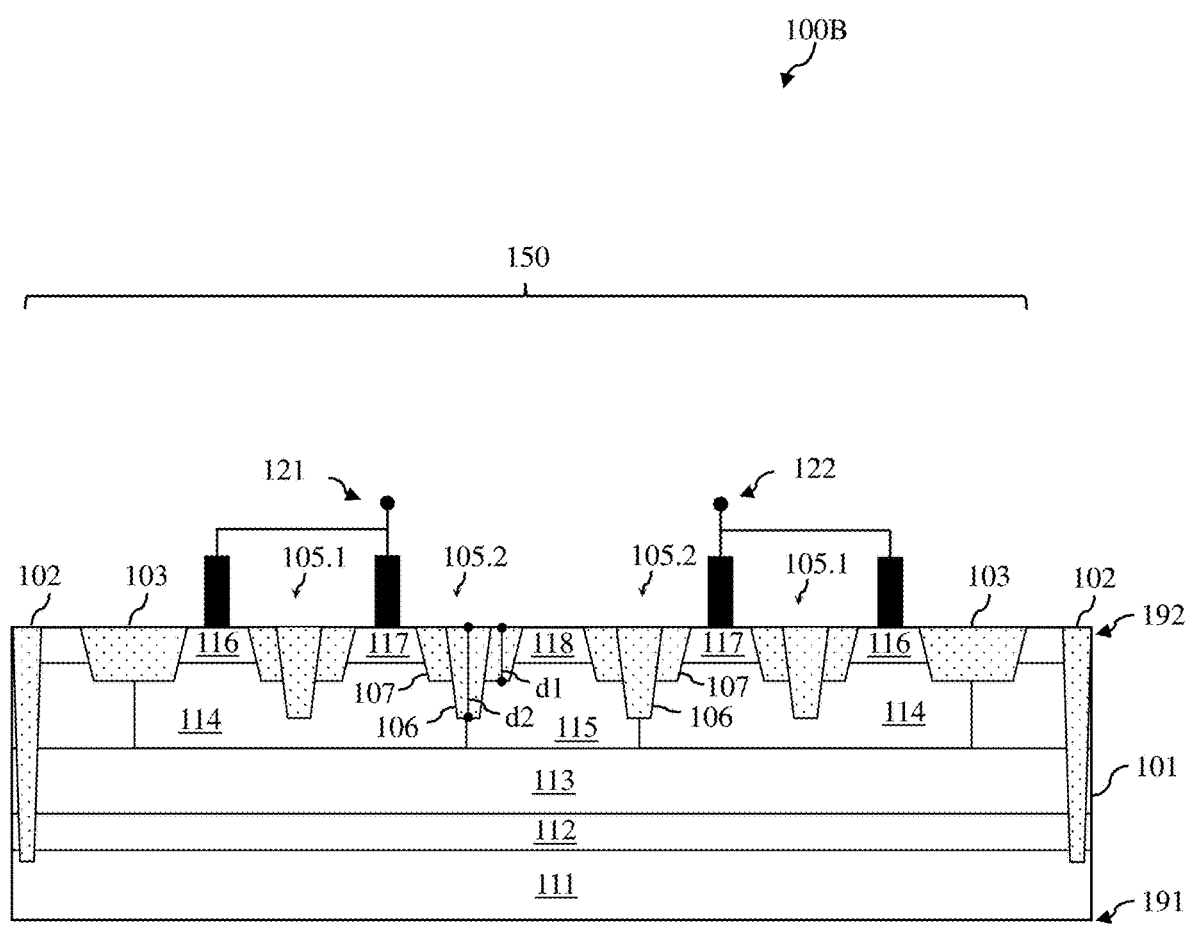
Figure 1C:
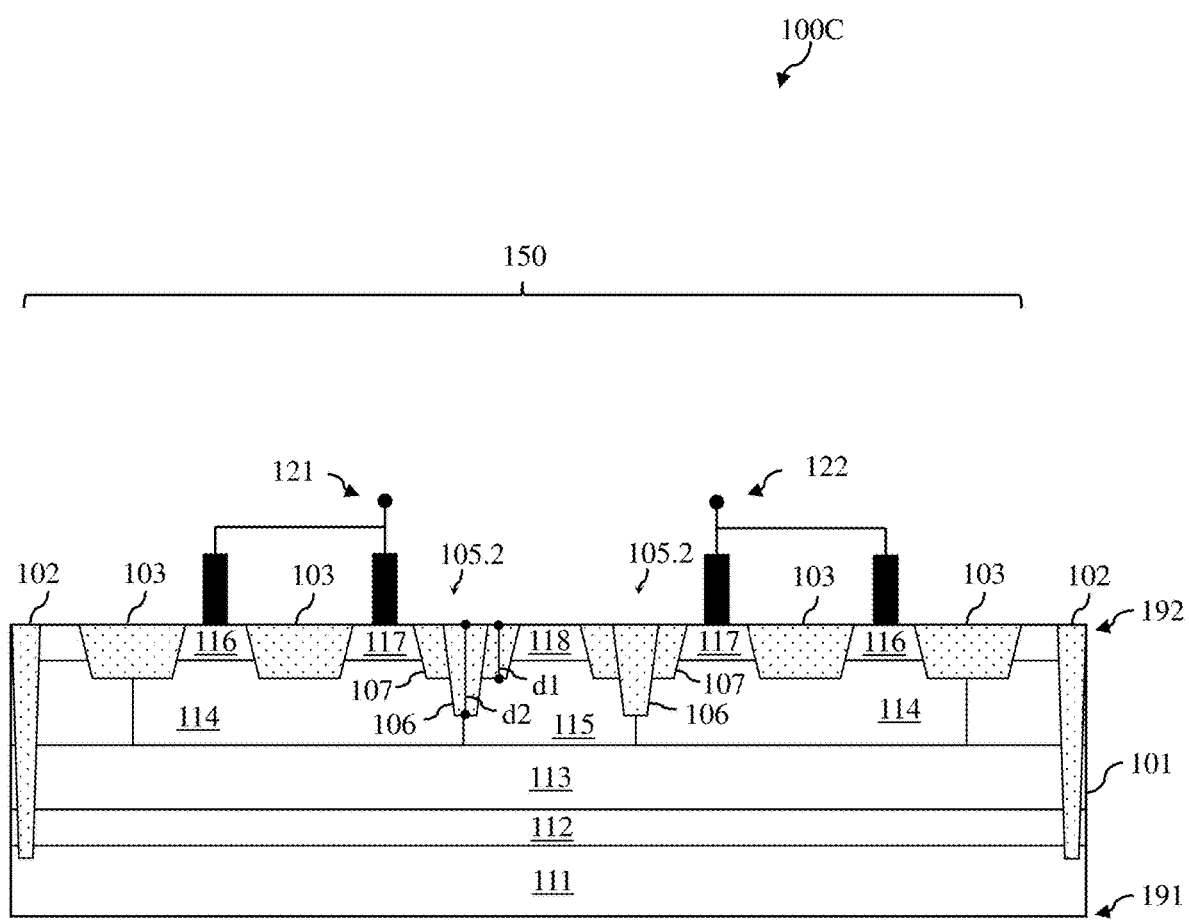
Figure 2A:
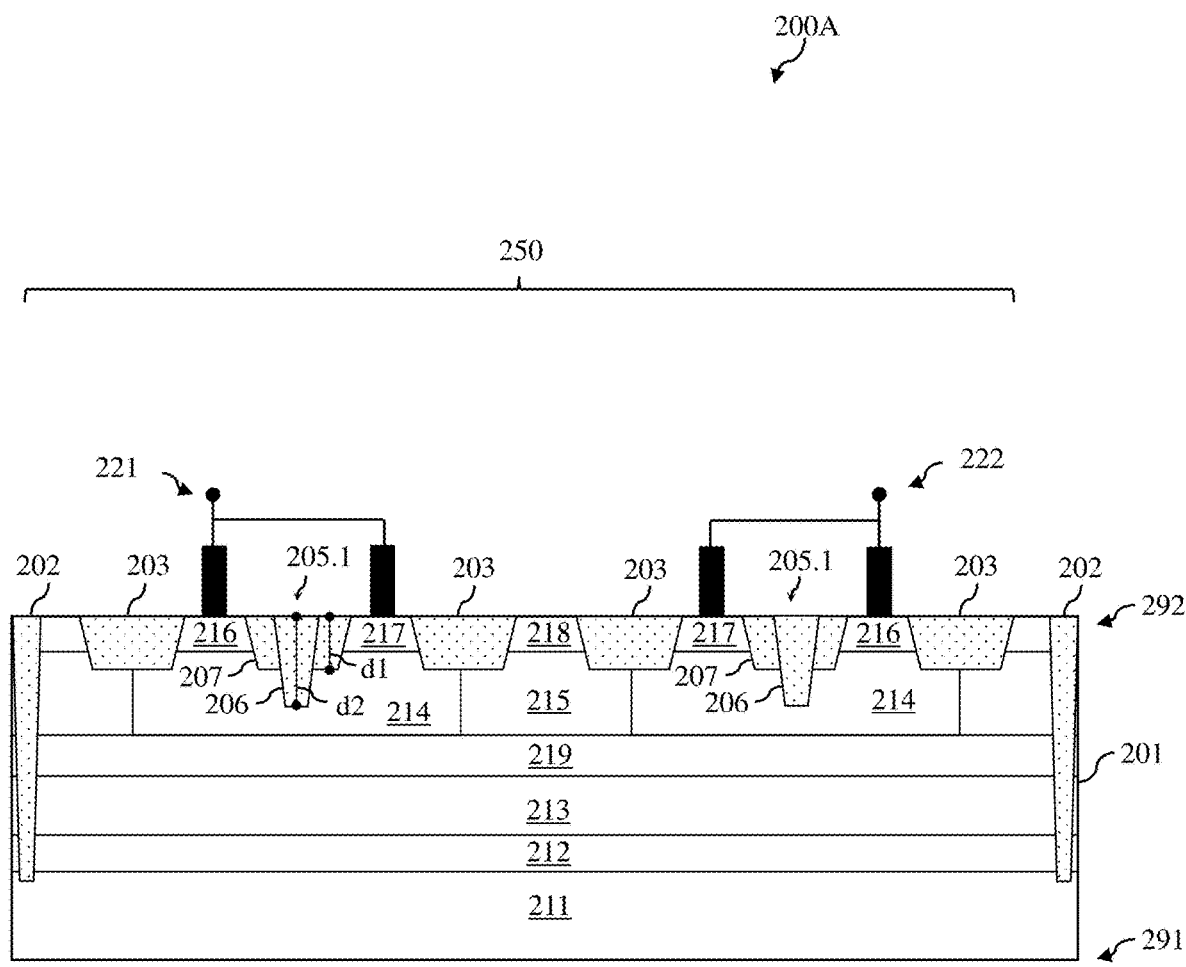
FIGS. 2A-2C are cross-section diagrams illustrating alternative embodiments of a disclosed semiconductor structure, respectively.
Figure 2B:
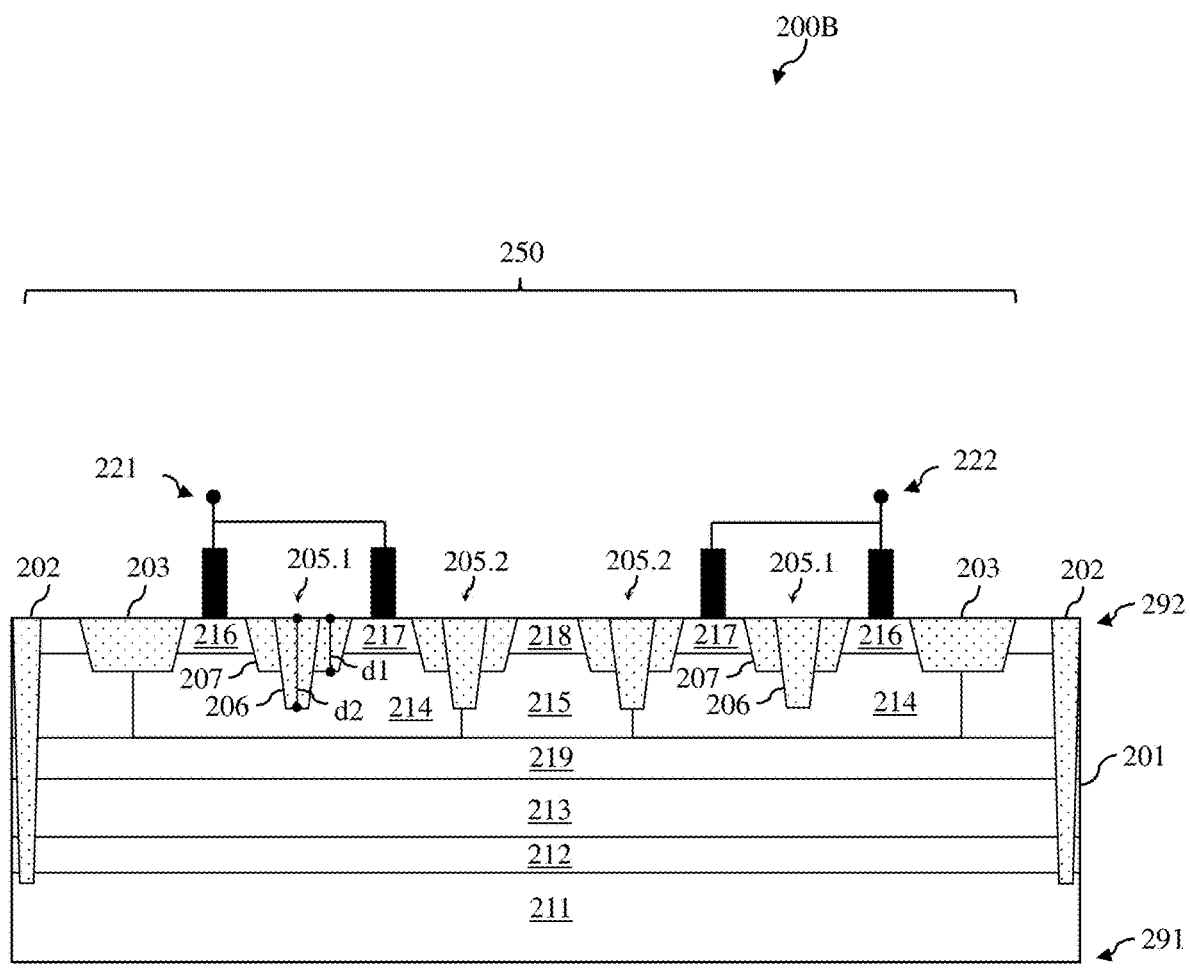
Figure 2C:
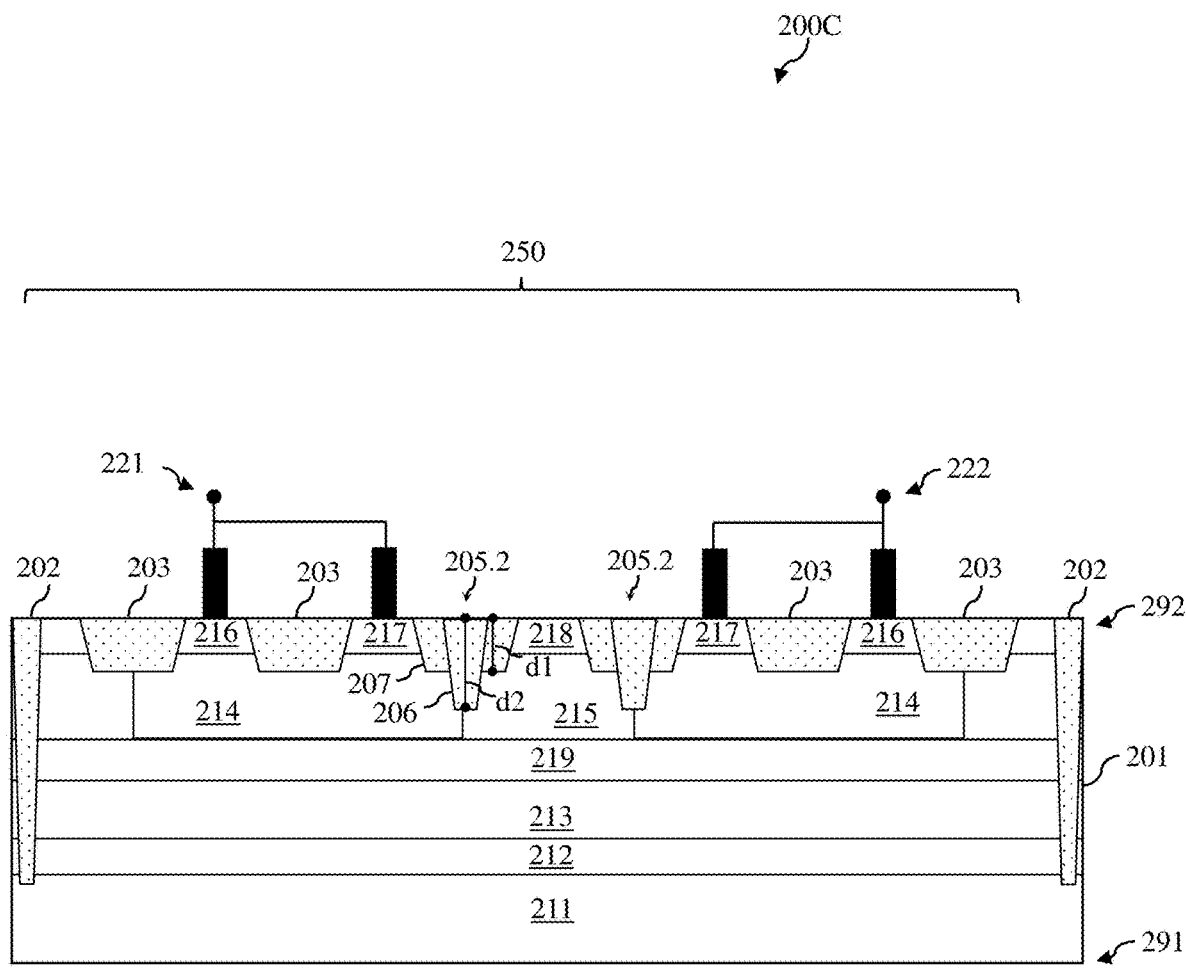

FIGS. 1A-1C are cross-section diagrams illustrating embodiments of a semiconductor structure 100A-100C, respectively. FIGS. 2A-2C are cross-section diagrams illustrating alternative embodiments of a semiconductor structure 200A-200C, respectively. Each of these embodiments includes a device 150, 250 (e.g., an essentially symmetric bi-directional semiconductor-controlled rectifier, such as an essentially symmetric bi-directional silicon-controlled rectifier (BDSCR)) and, within the device 150, 250, at least two dual-level isolation (DLI) structures 105.1 and/or 105.2, 205.1 and/or 205.2, as discussed in greater detail below.

More specifically, referring to FIGS. 1A-1C and 2A-2C, semiconductor structure 100A-100C, 200A-200C can include a semiconductor substrate 101, 201. Semiconductor substrate 101, 201 can include a first surface 191, 291 (also referred to herein as a bottom surface) and a second surface 192, 292 (also referred to herein as a top surface) opposite the first surface 191, 291. Semiconductor substrate 101, 201 could be a bulk monocrystalline semiconductor substrate ((e.g., a bulk silicon substrate or a bulk monocrystalline substrate of any other suitable monocrystalline semiconductor materials) and, optionally, one or more epitaxial semiconductor layers (e.g., epitaxial silicon layer(s) or epitaxial layers of any other suitable semiconductor material).

Semiconductor structure 100A-100C, 200A-200C can further include device 150, 250 within semiconductor substrate 101, 201. As mentioned above, device 150, 250 can be an essentially symmetric bi-directional semiconductor-controlled rectifier (e.g., a BDSCR). Those skilled in the art will recognize that a BDSCR is a type of bidirectional triode thyristor that includes a first semiconductor-controlled rectifier (e.g., a first SCR) that is operable in a first direction and a second semiconductor-controlled rectifier (e.g., a second SCR) that is operable in a second direction opposite the first direction.

Specifically, device 150, 250 can include multiple wells. For purposes of this disclosure, a well refers to an area of semiconductor material doped with a particular type of dopant so as to achieve a particular type of conductivity (e.g., N-type conductivity or P-type conductivity) at a particular conductivity level (see detailed discussion regarding such dopants). The wells can extend into semiconductor substrate 101, 201 to some depth below second surface 192, 292 and can include two first wells 114, 214 and a second well 115, 215 positioned laterally between and immediately adjacent to the two first wells 114, 214. The two first wells 114, 214 can have a first type conductivity and the second well 115, 215 can have a second type conductivity that is different from the first type conductivity. Each first well 114, 214 can be positioned laterally between and immediately adjacent to the second well 115, 215 and either an additional second well having the second type conductivity (as shown) or a deep trench isolation (DTI) structure (see discussion of DTI structures below).

Depending upon the embodiment, the first type conductivity can be P-type conductivity and the second type conductivity can be N-type conductivity or vice versa. For example, in device 150 of semiconductor structure 100A-100C of FIGS. 1A-1C, the first type conductivity can be P-type conductivity and the second type conductivity can be N-type conductivity. However, in device 250 of semiconductor structure 200A-200C of FIGS. 2A-2C, the first type conductivity can be N-type conductivity and the second type conductivity can be P-type conductivity. It should be noted that these different embodiments will also have differences in the in-substrate layers below the wells for isolation of device 150, 250 from a lower portion 111, 211 of semiconductor substrate 101, 201.

For example, consider semiconductor structure 100A-100C of FIGS. 1A-1C, where the first and second type conductivities are P-type and N-type conductivities, respectively, so that first wells 114 are P-type wells (Pwells) and second well 115 is an N-type well (Nwell). In this case, semiconductor substrate 101 can have a lower portion 111, which is adjacent to first surface 191, and doped so as to have P-type conductivity at a relatively low conductivity level (e.g., so as to be a P-lower portion). Semiconductor substrate 101 can further include one or more N-type buried semiconductor layers between the multiple wells 114-115 and the P-lower portion 111. The N-type buried semiconductor layer(s) can include an N-type buried semiconductor layer 112, which is above and immediately adjacent to P-lower portion 111 and which is doped so as to have N-type conductivity at a relatively high conductivity level (e.g., so as to be an N+ buried semiconductor layer). Optionally, the N-type buried semiconductor layer(s) can further include an additional N-type buried semiconductor layer 113, which is between wells 114-115 and N-type buried semiconductor layer 112 and which has N-type conductivity. Conductivity level of additional N-type buried semiconductor layer 113 can, for example, be less than that of both Nwell 115 and N-type buried semiconductor layer 112. Layers 112-113 can, for example, be buried wells (e.g., if semiconductor substrate 101 is a bulk semiconductor substrate between first and second surfaces 191-192) or buried epitaxial semiconductor layers (e.g., if semiconductor substrate 101 is a multi-layered semiconductor structure).

Alternatively, consider semiconductor structure 200A-200C of FIGS. 2A-2C, where the first and second type conductivities are N-type and P-type conductivities, respectively, so that first wells 214 are Nwells and second well 215 is a Pwell. In this case, semiconductor substrate 201 can have lower portion 211, which is adjacent to first surface 291 and doped so as to have P-type conductivity at a relatively low conductivity level (e.g., so as to be a P-lower portion). Semiconductor substrate 201 can further include a P-type buried semiconductor layer and one or more N-type buried semiconductor layers between the multiple wells 214-215 and the P-lower portion 211. The buried N-type semiconductor layer(s) can include an N-type semiconductor layer 212, which is above and immediately adjacent to P-lower portion 211 and which is doped so as to have N-type conductivity at a relatively high conductivity level (e.g., so as to be an N+ buried semiconductor layer). Optionally, the buried N-type semiconductor layer(s) can further include an additional buried N-type semiconductor layer 213, which is above buried N-type semiconductor layer 212 and which has N-type conductivity. Conductivity level of additional buried N-type semiconductor layer 213 can, for example, be less than that of both Nwells 214 and buried N-type semiconductor layer 212. P-type buried semiconductor layer 219 can be between wells 214-215 and the N-type buried semiconductor layers. P-type buried semiconductor layer 219 can, for example, have a conductivity level that is higher than the P-lower portion 211 and at or lower than that of Pwell 215. Layers 212-213 and 219 can, for example, be buried wells (e.g., if semiconductor substrate 201 is a bulk semiconductor substrate between first and second surfaces 291-292) or buried epitaxial semiconductor layers (e.g., if semiconductor substrate 201 is a multi-layered semiconductor structure).

Referring again to FIGS. 1A-1C and 2A-2C, device 150, 250 can further include, adjacent each first well 114, 214, a first contact region 116, 216 with the first type conductivity at a relatively high conductivity level and a second contact region 117, 217 with the second type conductivity at a relatively high conductivity level. First and second contact regions 116-117, 216-217 can be located at second surface 192, 292 of semiconductor substrate 101, 201 either within each first well 114, 214 (e.g., as shallow dopant implant regions) or on each first well 114, 214 (e.g., as doped epitaxial layers). In device 150 of semiconductor structure 100A-100C of FIGS. 1A-1C where first wells 114 are Pwells, first contact region 116 can be an N+ contact region and second contact region 117 can be a P+ contact region. In device 250 of semiconductor structure 200A-200C of FIGS. 2A-2C where first wells 214 are Nwells, first contact region 216 can be a P+ contact region and second contact region 217 can be an N+ contact region. On one side of device 150, 250, first and second contact regions 116-117, 216-217 can be electrically connected to an anode terminal 121, 221 (e.g., see left side of figures). On the opposite side of device 150, 250, first and second contact regions 116-117, 216-217 can be electrically connected to a cathode terminal 122, 222 (e.g., see right side of figures).

Optionally, device 150, 250 can further include an additional contact region 118, 218 adjacent to second well 115, 215. Additional contact region 118, 218 can have the second type conductivity at a relatively high conductivity level and can be located at second surface 192, 292 (e.g., positioned laterally between second contact regions 117, 217 in each of the first wells 114, 214). Thus, in device 150 of semiconductor structure 100A-100C of FIGS. 1A-1C where second well 115 is an Nwell, additional contact region 118 can be an N+ contact region. In device 250 of semiconductor structure 200A-200C of FIGS. 2A-2C where second well 215 is a Pwell, additional contact region 218 can be a P+ contact region. Additional contact region 118, 218 can be within second well 115, 215 (e.g., as a shallow dopant implant region) or on second well 115, 215 (e.g., as a doped epitaxial semiconductor layer).

Semiconductor structure 100A-100C, 200A-200C can further include various isolation structures, as discussed below.

Optionally, semiconductor structure 100A-100C, 200A-200C can include deep trench isolation (DTI) structures 102, 202 to electrically isolate device 150, 250 form other devices in and/or on semiconductor substrate 101, 201. For example, as illustrated, device 150, 250 can be positioned laterally between (and, more particularly, can be laterally surrounded by) DTI structures 102, 202. Each DTI structure 102, 202 can include, for example, a deep trench that extends vertically from second surface 192, 292 toward first surface 191, 291 at least through an in-substrate buried semiconductor layer immediately below wells 114-115, 214-215 and, optionally, into a P-lower portion 111, 211 of semiconductor substrate 101, 201. Each DTI structure 102, 202 can further be filled with one or more layers of isolation material. The isolation material of DTI structures 102, 202 can include, for example, any of an oxide material, an undoped semiconductor material (e.g., undoped polysilicon), or any other suitable DTI fill material.

Semiconductor structure 100A-100C, 200A-200C can further include shallow trench isolation (STI) structures 103, 203 within device 150, 250. Locations of such STI structures 103, 203 within device 150, 250 are embodiment-dependent and discussed in greater detail below. In any case, each STI structure 103, 203 can include, for example, a shallow trench that extends vertically from second surface 192, 292 toward first surface 191, 291 to a first depth d1 below the bottoms of contact regions 116-118, 216-218 (i.e., into upper portions of the wells below). Each STI structure 103, 203 can further be filled with one or more layers of isolation material. The isolation material of STI structures 103, 203 can include, for example, any of an oxide material (e.g., silicon dioxide), an oxynitride material (e.g., silicon oxynitride), a nitride material (e.g., silicon nitride), or any other suitable STI fill material.

Semiconductor structure 100A-100C, 200A-200C can further include at least two dual-level isolation (DLI) structures (e.g., see DLI structures 105.1 and/or 105.2, 205.1 and/or 205.2) within device 150, 250. Locations of such DLI structures within device 150, 250 are embodiment-dependent and discussed in greater detail below. In any case, each DLI structure can include a first section 107, 207 that extends vertically from second surface 192, 292 toward first surface 191, 291 to the first depth (d1) below the bottoms of contact regions 116-118, 216-218.

Each DLI structure can further include at least one second section 106, 206. Each second section 106, 206 can have an upper portion that extends vertically completely through first section 107, 207 and a lower portion that extends into semiconductor substrate 101, 201 to a second depth (d2) that is below d1 (i.e., d2 is closer to first surface 191, 291 than d1). It should be noted that any one of various different example DLI structure configurations A-F, as shown in FIGS. 3A-3F, could be employed for DLI structures 105.1-105.2, 205.1-205.2. That is, semiconductors structures 100A-100C, 200A-200C are shown in the figures as including DLI structures with DLI configuration A of FIG. 3A. However, alternatively, semiconductors structures 100A-100C, 200A-200C could have any of the other example DLI configurations illustrated in FIGS. 3B-3F and described below or the like.

Figure 3A:
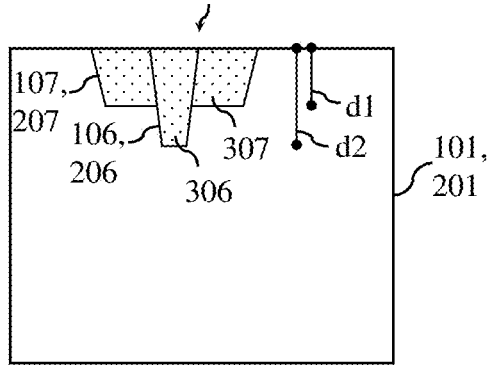
FIGS. 3A-3F are cross-section diagrams illustrating alternative configurations for a dual-level isolation structure that can be included in the semiconductor structures of FIGS. 1A-2C.
Figure 3B:
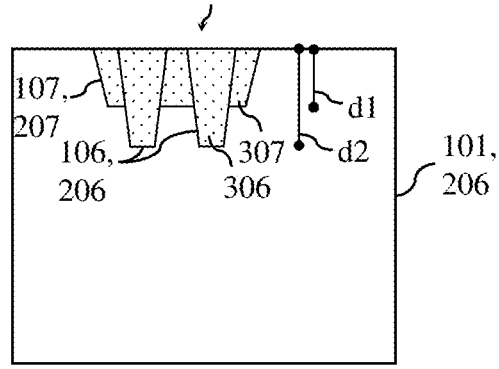
Figure 3C:
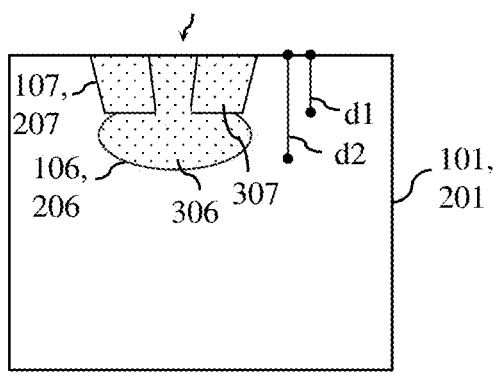
Figure 3D:
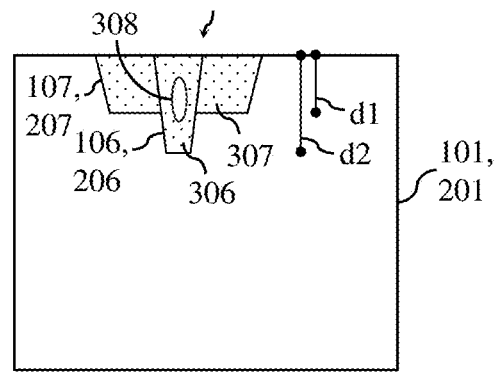
Figure 3E:
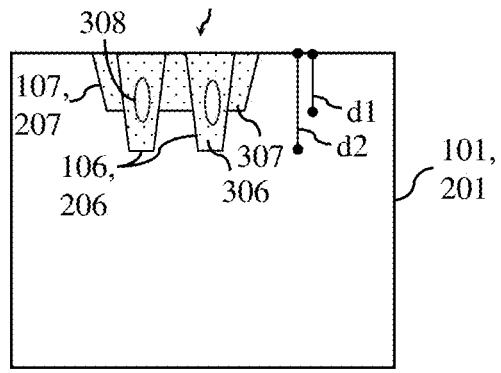

More specifically, referring to FIGS. 1A-1C, 2A-2C and 3A-3F, each DLI structure 105.1 and/or 105.2, 205.1 and/or 205.2 can include a first section 107, 207 and either: (a) a single second section 106, 206 extending completely through the first section 107, 207 and into semiconductor substrate 101, 201 to d2 (e.g., see FIGS. 1A-1C, 2A-2C, and 3A, 3C-3D, and 3F) or (b) multiple second sections 106, 206 extending completely through the first section 107, 207 and into semiconductor substrate 101, 201 to d2 (e.g., see FIGS. 3B and 3E). For purposes of illustration, FIGS. 3B and 3E show DLI configurations B and E as having only two second sections 106, 206 extending through a first section 107, 207. However, it should be understood that FIGS. 3B and 3E are not intended to be limiting. Alternatively, with this DLI configuration, DLI structures 105.1 and/or 105.2, 205.1 and/or 205.2 could have any number of two or more second sections. Furthermore, the second sections could be arranged in a single row or, alternatively, in an array including multiple rows.

In any case, first section 107, 207 of each DLI structure 105.1 and/or 105.2, 205.1 and/or 205.2 can include a shallow trench, which extends from second surface 192, 292 toward first surface 191, 291 to first depth (d1) (which, as mentioned above, is below the bottoms of contact regions 116-118, 216-218). First section 107, 207 can further be filled with one or more layers of first isolation material 307 (see FIGS. 3A-3F). During processing, first sections of DLI structures and STI structures can be formed concurrently such that first isolation material 307 and the isolation material used for STI structures 103, 203 is the same. Thus, first isolation material 307 can include any of an oxide material (e.g., silicon dioxide), an oxynitride material (e.g., silicon oxynitride), a nitride material (e.g., silicon nitride), or any other suitable fill material.

Each second section 106, 206 can include an additional trench, which extends completely through the first section 107, 207 and into semiconductor substrate 101, 201 toward first surface 191, 291 to second depth (d2). As illustrated, d2 can be below d1 but above any buried semiconductor layers. For example, in semiconductor structures 100A-100C of FIGS. 1A-1C, d2 is below d1 and above N-type buried semiconductor layer(s) 112-113. In semiconductor structures 200A-200C of FIGS. 2A-2C, d2 is below d1 and above P-type buried semiconductor layer 219. Each second section 106, 206 can further be filled with one or more layers of second isolation material 306 (see FIGS. 3A-3F). Second isolation material 306 can be the same as or different from first isolation material 307. For example, second isolation material 306 and first isolation material 307 can be the same oxide material, same oxynitride material, etc. Alternatively, different isolation materials could be employed in the different sections. For example, first section 107, 207 could include one type of isolation material and second section(s) 106, 206 could include a different type of isolation material. In another example, the two sections could have different numbers of layers of isolation material.

In some DLI structure configurations (e.g., DLI structure configurations A, B, D, and E illustrated in FIGS. 3A, 3B, 3D, and 3E, respectively), each second section 106, 206 could be narrower in width than first section 107, 207 through which it extends. In other DLI structure configurations (e.g., DLI structure configurations C and F illustrated in FIGS. 3C and 3F, respectively)), the upper portion of the second section 106, 206 (which extends through first section 107, 207) can be narrower in width than the first section 107, 207 and the lower portion of the second section 106, 206 (which extends into semiconductor substrate 101, 201) can be wider than the upper portion. In this case, the lower portion of second section 106, 206 could also be narrower than, the same as, or wider than first section 107, 207.

Figure 3F:
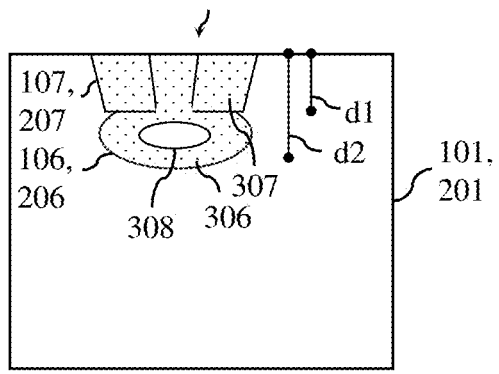

In some DLI structure configurations (e.g., DLI structure configurations D-F illustrated in FIGS. 3D-3F, respectively), second isolation material 306 may encapsulate a pocket 308 of trapped air or some other gas or combination of gases (also referred to herein as an air gap or gas-filled gap) (e.g., see DLI structure configurations D-F of FIGS. 3D-3F, respectively.) Those skilled in the art will recognize that an air gap or gas-filled gap may occur during processing depending upon the aspect ratio of the trench employed for a second section 106, 206 and further depending upon the deposition techniques used to fill the second section with second isolation material.

As mentioned above, locations of DLI structures and STI structures within device 150, 250 are embodiment-dependent.

For example, referring to FIGS. 1A and 2A, semiconductor structure 100A, 200A can include two first DLI structures 105.1, 205.1. The two first DLI structures 105.1, 205.1 can be within the two first wells 114, 214, respectively. Each first DLI structure 105.1, 205.1 within a corresponding first well 114, 214 can be positioned laterally between and immediately adjacent to the first and second contact regions 116-117, 216-217 within that first well 114, 214. In these embodiments, STI structures 103, 203 can, optionally, be located at the junctions between first wells 114, 214 and second well 115, 215 and/or laterally surrounding device 150, 250.

Referring to FIGS. 1B and 2B, semiconductor structure 100B, 200B can include two first DLI structures 105.1, 205.1 in first wells 114, 214 positioned laterally between and immediately adjacent to first and second contact regions 116-117, 216-217 therein (as described above with regard to FIGS. 1A and 2A) and two second DLI structures 105.2, 205.2. The two second DLI structures 105.2, 205.2 can be located at the junctions between first wells 114, 214 and second well 115, 215. In these embodiments, STI structures 103, 203 can, optionally, laterally surround device 150, 250.

Referring to FIGS. 1C and 2C, semiconductor structure 100C, 200C can include only the two second DLI structures 105.2, 205.2 at the junctions between first wells 114, 214 and second well 115, 215 (as described above with regard to FIGS. 1B and 2B). In these embodiments, STI structures 103, 203 can be located within first wells 114, 214 positioned laterally between and immediately adjacent first and second contact regions 116-117, 216-217 therein and, optionally, laterally surrounding device 150, 250.

Generally, techniques for forming the various in-substrate layers, wells, and contact regions for a device 150, 250, as described above, are known in the art. Such techniques can include, but are not limited to, performing masked dopant implantation processes with different specifications (e.g., different dopants, dopant concentrations, energy levels, etc.), performing in situ-doped epitaxial semiconductor deposition processes, etc. Additionally, techniques for forming STI structures and DTI structures are also known in the art. Such techniques can include forming trenches (e.g., using conventional lithographic patterning and etch processes), forming isolation material within the trenches (e.g., using any of various different deposition techniques), and performing a polishing process (e.g., a chemical mechanical polishing (CMP) process) to remove excess isolation material deposited outside the trenches. It should be understood that more specific details of these techniques have been omitted from the specification in order to allow the reader to focus on the salient aspects of the disclosed semiconductor structure embodiments related to DLI structures 105.1 and/ or 105.2, 205.1 and/or 205.2 within device 150, 250, as described above and illustrated in FIGS. 1A-1C, 2A-2C, and 3A-3F.

Figure 4:
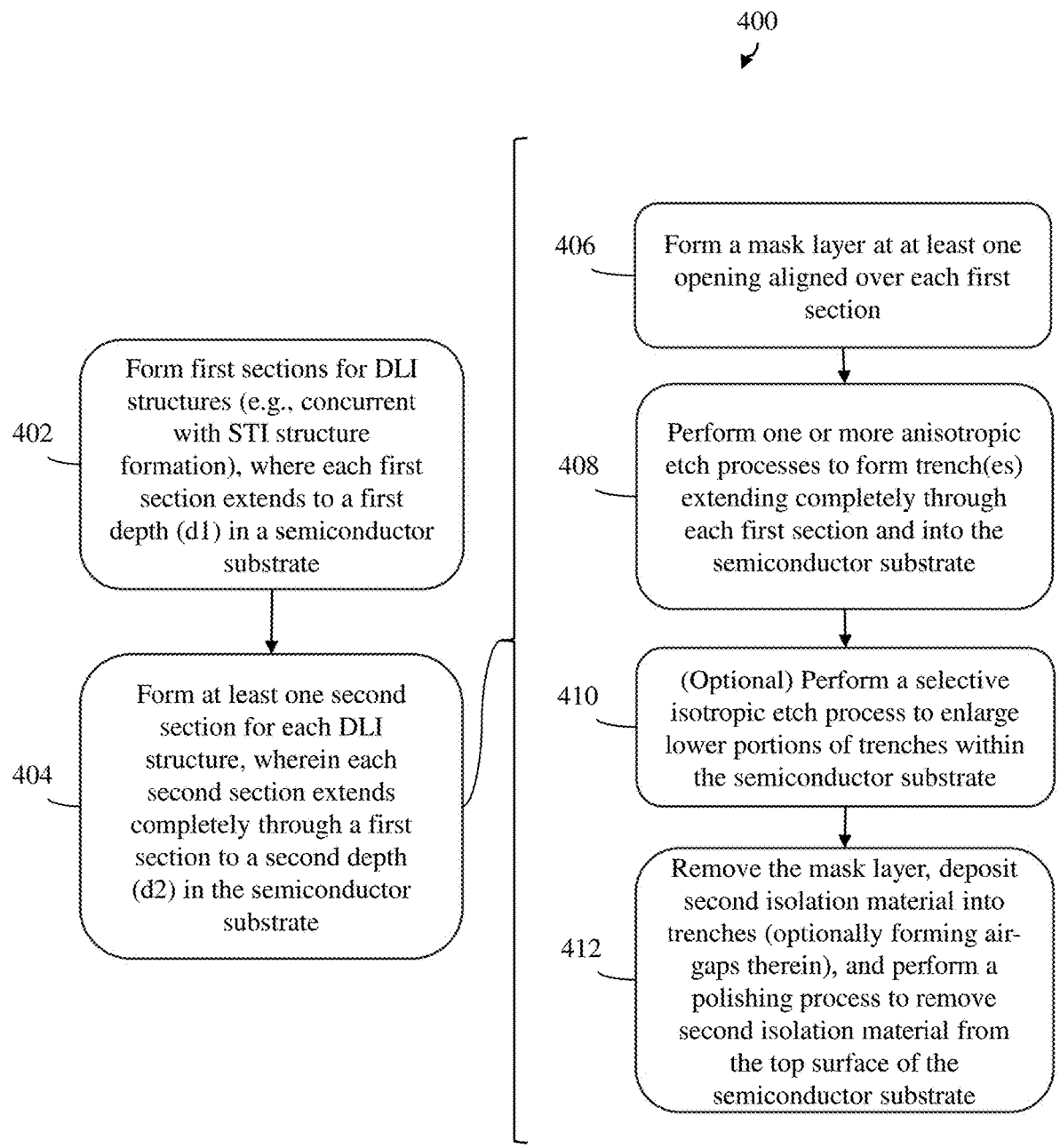
FIG. 4 is a flow diagram illustrating a dual-level isolation (DLI) structure formation technique.

FIG. 4 is a flow diagram illustrating embodiments of a method of forming DLI structures within a device 150, 250, such as a bidirectional semiconductor-controlled rectifier or BDSCR, of a semiconductor structure 100A-100C of FIG. 1A-1C or 200A-200C of FIGS. 2A-2c. FIGS. 5.1-5.3 are cross-section diagrams illustrating processes 402-406 of FIG. 4 with respect to the formation of a DLI structure having the DLI structure configuration A of FIG. 3A or D of FIG. 3D. FIGS. 6.1-6.3 are cross-section diagrams illustrating processes 402-406 of FIG. 4 with respect to the formation of a DLI structure having the DLI structure configuration B of FIG. 3B or E of FIG. 3E. FIGS. 7.1-7.4 are cross-section diagrams illustrating processes 402-408 of FIG. 4 with respect to the formation of a DLI structure having the DLI structure configuration C of FIG. 3C or F of FIG. 3F. It should be understood that, while FIGS. 5.1-7.4 each show processes employed in the formation of a single DLI structure, at least two DLI structures would concurrently be formed at corresponding locations on opposite sides of device 150, 250 to ensure that the device retains an essentially symmetric structure.

More particularly, the method can include providing a semiconductor substrate 101, 201 and forming the following within semiconductor substrate 101, 201: a device 150, 250; optional DTI structures 102, 202; STI structures 103, 203; and at least two DLI structures 105.1 and/or 105.2, 205.1 and/or 205.2 within the device 150, 250. As mentioned techniques for forming components of device 150, 250, optional DTI structures 102, 202, and STI structures are known in the art and omitted from the specification in order to allow the reader to focus on the salient aspects of the disclosed embodiments related to DLI structure formation.

To form DLI structures 105.1 and/or 105.2, 205.1 and/or 205.2, a first section 107, 207 for each DLI structure can be formed so that it extends a first depth (d1) into a semiconductor substrate 101, 201 (see process 402 and FIGS. 5.1, 6.1 and 7.1). Specifically, first sections 107, 207 of DLI structures can be formed at process 402 concurrent with STI structure formation and using STI processing techniques. That is, for each first section 107, 207, a shallow trench can be formed (e.g., using conventional lithographic patterning and etch techniques) such that it placed at a desired location within the device and such that it extends from second surface 192, 292 of semiconductor substrate 101, 201 to the first depth (d1). One or more layers of first isolation material 307 can be deposited so as to fill the shallow trench. First isolation material 307 can include any of an oxide material (e.g., silicon dioxide), an oxynitride material (e.g., silicon oxynitride), a nitride material (e.g., silicon nitride), or any other suitable fill material. A polishing process (e.g., a chemical mechanical polishing (CMP) process) can then be performed to remove any first isolation material from above the top surface of the substrate.

To form DLI structures 105.1 and/or 105.2, 205.1 and/or 205.2, at least one second section 106, 206 for each DLI structure can be formed so that it extends completely through the first section 107, 207 and into the semiconductor substrate 101, 201 to a second depth (d2) (see process 404). For example, mask layer (e.g., a nitride mask) can be formed over the device area and one or more openings can be formed in the mask layer (e.g., using conventional lithographic patterning and etch techniques) over each first section 107, 207 (see opening 502 in mask layer 501 of FIG. 5.2, openings 602 in mask layer 601 of FIG. 6.2, and opening 702 in mask layer 701 of FIG. 7.2). One or more anisotropic etch processes can then be performed. These anisotropic etch process(es) can be performed so that a trench is formed below each opening in the mask layer and so that the trench extends completely through a first section 107, 207 and into semiconductor substrate 101, 201 (see trench 503 of FIG. 5.3, trenches 603 of FIG. 6.3, and trench 703 of FIG. 7.3). Optionally, a selective isotropic etch process can be performed in order to enlarge the lower portion of any trench within semiconductor substrate 101, 201 (see process 410). For example, as illustrated in FIG. 7.4, a selective isotropic etch process can be performed so that the resulting trench for the second section 106, 206 includes an upper portion 703a, which extends through first section 107, 207 and a lower portion 703b, which extends into semiconductor substrate 101, 201 and is wider than the upper portion 703a. The mask layer can then be removed, one or more layers of second isolation material 306 can be deposited into the second section trenches, and a polishing process (e.g., a CMP process) can be performed to remove any excess second isolation material 306 deposited outside the trenches (see process 412 and FIGS. 3A-3F). Second isolation material 306 can be the same as or different from first isolation material 307. For example, second isolation material 306 and first isolation material 307 can be the same oxide material, same oxynitride material, etc. Alternatively, different isolation materials could be employed in the different sections. For example, first section could include one type of isolation material and second section(s) could include a different type of isolation material. In another example, the two sections could have different numbers of layers of isolation material. It should be understood that, depending upon the aspect ratio of the second section trenches and the deposition techniques used for second isolation material 306, the second section trenches may be completely filled with second isolation material 306 (as illustrated in FIGS. 3A-3C) or, may include a pocket 308 of trapped air or gas(es) (i.e., an air gap or gas-filled gap) encapsulated by second isolation material 306 (as illustrated in FIGS. 3D-3F).

As mentioned above, in the disclosed embodiments, device 150 of semiconductor structure 100A-100C of FIGS. 1A-1C and device 250 of semiconductor structure 200A-200C of FIGS. 2A-2C are essentially symmetric bi-directional semiconductor-controlled rectifiers (e.g., BDSCRs).

In device 150 of FIGS. 1A-1C, if a positive pulse is applied across the two terminals (e.g., the anode terminal 121 and the cathode terminal 122), then an NPN transistor (formed by cathode side N+ contact region 117, cathode side Pwell 114, and center Nwell 115) and a PNP transistor (formed by cathode side P+ contact region 116 and cathode side Pwell 114, center Nwell 115 and anode side Pwell 114 and anode side P+ contact region 116) will turn on and a first SCR directional device of the BDSCR 150 is triggered into a snap-back mode. If a negative pulse is applied across the two terminals (e.g., anode terminal 121 and cathode terminal 122), then a different NPN transistor (formed by anode side N+ contact region 117, anode side Pwell 114, and center Nwell 115) and the PNP transistor (again formed by cathode side P+ contact region 116 and cathode side Pwell 114, center Nwell 115 and anode side Pwell 114 and anode side P+ contact region 116) will turn on and a second SCR directional device of BDSCR 150 is triggered into a snap-back mode. In these structures, center Nwell 115 can be left floating.

Similarly, in device 250 of FIGS. 2A-2C, if a negative pulse is applied across the two terminals (e.g., anode terminal 221 and cathode terminal 222), then a PNP transistor (formed by cathode side P+ contact region 217, cathode side Nwell 214, and center Pwell 215) and an NPN transistor (formed by cathode side N+ contact region 216 and cathode side Nwell 214, center Pwell 215 and anode side Nwell 214 and anode side N+ contact region 216) will turn on and a first SCR directional device of the BDSCR 250 is triggered into a snap-back mode. If a positive pulse is applied across the two terminals (e.g., anode terminal 221 and cathode terminal 222), then a different PNP transistor (formed by anode side P+ contact region 217, anode side Nwell 214, and center Pwell 215) and the NPN transistor (again formed by cathode side N+ contact region 216 and cathode side Nwell 214, center Pwell 215 and anode side Nwell 214 and anode side N+ contact region 216) will turn on and a second SCR directional device of BDSCR 250 is triggered into a snap-back mode. In these structures, center Pwell 215 can be left floating.

Figure 8:
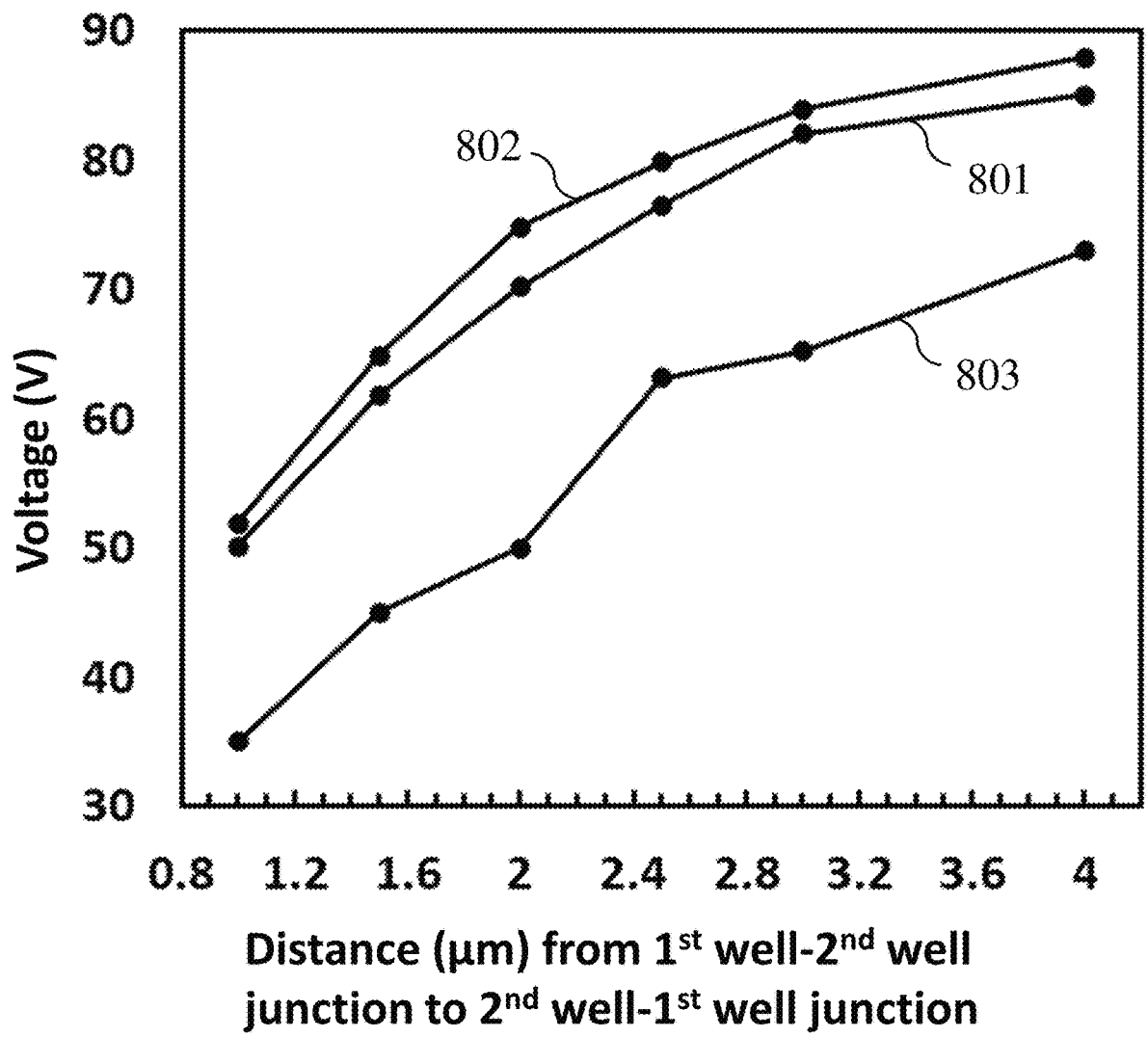
FIG. 8 is a graph illustrating reduced trigger voltage exhibited in devices with DLI structures as opposed to conventional shallow trench isolation (STI) structures.

In each of the disclosed semiconductor structure embodiments, DTI structures 105.1 and/or 105.2, 205.1 and/or 205.2 included within device 150, 250 effectively increase resistance within and/or across wells 114-115, 214-215 in a lateral direction and further cause current to flow deeper down and around second section(s) 106, 206. As a result, a trigger voltage of device 150, 250 may be reduced (e.g., without increasing device size) as compared to a device that includes only STI structures therein. More specifically, the graph of FIG. 8 shows a first curve 801 representing changes in the DC breakdown voltage of a BDSCR with changes in the distance between a first well-to-second well junction and a second well-to-first well junction on opposite sides of the BDSCR (referred to herein after as the junction-to-junction distance). As illustrated by first curve 801, as the junction-to-junction distance increases so does the DC breakdown voltage. The graph of FIG. 8 further shows two additional curves (i.e., a second curve 802 and a third curve 803), which represent changes in the trigger voltage of a BDSCR with changes in the junction-to-junction distance for different BDSCR devices. Specifically, the second curve 802 corresponds to a BDSCR that includes only STI structures, whereas the third curve 803 corresponds to a BDSCR with DLI structures (instead of STI structures) within the first wells between first and second contact regions (e.g., as in FIG. 1A or 2A). As illustrated by second curve 802 and third curve 803, in both BDSCR devices as the junction-to-junction distance increases so does the trigger voltage. However, if only STI structures are employed within the BDSCR, the trigger voltage remains relatively high (e.g., close to the DC breakdown voltage) as shown in second curve 802, whereas, if DLI structures are employed within the BDSCR, the trigger voltage drops significantly as shown in third curve 803.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate having a surface;
   first trench isolation structures extending from the surface through a buried semiconductor layer to a lower portion of the semiconductor substrate;
   a device in the semiconductor substrate positioned laterally between the first trench isolation structures, wherein the device includes a semiconductor-controlled rectifier including multiple wells including:
      two first wells adjacent to the surface, extending to the buried semiconductor layer, and having a first type conductivity; and
      a second well adjacent to the surface, extending to the buried semiconductor layer, positioned laterally between the first wells and having a second type conductivity; and
   multiple isolation structures with the device and including at least two dual-level isolation structures within the device,
   wherein each dual-level isolation structure has a first section extending into the semiconductor substrate from the surface to a first depth above the buried semiconductor layer and at least one second section extending through the first section and into the semiconductor substrate to a second depth greater than the first depth and above the buried semiconductor layer, and
   wherein the at least two dual-level isolation structures include at least one of:
      first dual-level isolation structures in the first wells; and
      second dual-level isolation structures between the second well and the first wells.

2. The structure of claim 1, wherein the multiple wells extend deeper into the semiconductor substrate than the second section of each dual-level isolation structure.

3. The structure of claim 1, wherein the device further includes, adjacent to each first well, a first contact region with the first type conductivity and a second contact region with the second type conductivity.

4. The structure of claim 3, wherein the at least two dual-level isolation structures include two first dual-level isolation structures within the two first wells, respectively, each positioned laterally between the first contact region and the second contact region of a corresponding first well.

5. The structure of claim 4, wherein the at least two dual-level isolation structures further include two second dual-level isolation structures, wherein junctions between the first wells and the second well extend vertically from the two second dual-level isolation structures to the buried semiconductor layer.

6. The structure of claim 5, wherein the at least two dual-level isolation structures include only the two second dual-level isolation structures.

7. The structure of claim 1, wherein, within each of the at least two dual-level isolation structures, the second section includes any of:
   a single second section narrower than the first section;
   multiple second sections each narrower than the first section; and
   an upper portion extending through the first section and a lower portion below the first section and wider than the upper portion.

8. The structure of claim 1, wherein the first section includes first isolation material and the second section includes second isolation material.

9. The structure of claim 8, wherein the second isolation material encapsulates a pocket of trapped air or gas.

10. The structure of claim 1,
    wherein first type conductivity is P-type conductivity,
    wherein the second type conductivity is N-type conductivity,
    wherein the semiconductor substrate further includes at least one buried N-type semiconductor layer,
    wherein the multiple wells are between the at least one buried N-type semiconductor layer and the surface.

11. The structure of claim 1,
    wherein first type conductivity is N-type conductivity,
    wherein the second type conductivity is P-type conductivity,
    wherein the semiconductor substrate further includes: a P-type buried semiconductor layer; and at least one N-type buried semiconductor layer, and
    wherein the P-type buried semiconductor layer is between the multiple wells and the at least one N-type buried semiconductor layer.

12. A structure comprising:
    a semiconductor substrate having a surface;
    first trench isolation structures extending from the surface through a buried semiconductor layer to a lower portion of the semiconductor substrate;
    a device in the semiconductor substrate positioned laterally between the first trench isolation structures, wherein the device includes a semiconductor-controlled rectifier including multiple wells including:
       two first wells adjacent to the surface, extending to the buried semiconductor layer, and having a first type conductivity; and
       a second well adjacent to the surface, extending to the buried semiconductor layer, positioned laterally between the first wells and having a second type conductivity; and
    multiple isolation structures with the device and including:
       dual-level isolation structures in the first wells; and
       second trench isolation structures between the second well and the first well;

wherein each dual-level isolation structure has a first section extending into the semiconductor substrate from the surface to a first depth above the buried semiconductor layer and at least one second section extending through the first section and into the semiconductor substrate to a second depth greater than the first depth and above the buried semiconductor layer, and wherein each second trench isolation structure extends into the semiconductor substrate from the surface to the first depth, and wherein junctions between the second well and the first wells extending from the second trench isolation structures to the buried semiconductor layer.

13. The structure of claim 12,
wherein the device further includes:
adjacent to each first well, a first contact region with the first type conductivity and a second contact region with the second type conductivity; and
an additional contact region adjacent to the second well and having the second type conductivity,
wherein each dual-level isolation structure is positioned laterally between the first contact region and the second contact region of a corresponding first well, and
wherein the additional contact region is positioned laterally between the second trench isolation structures.

14. The structure of claim 12, wherein, within each of the at least two dual-level isolation structures, the second section includes any of:
a single second section narrower than the first section;
multiple second sections each narrower than the first section; and
an upper portion extending through the first section and a lower portion below the first section and wider than the upper portion.

15. The structure of claim 12, wherein the first section includes first isolation material and the second section includes second isolation material.

16. The structure of claim 15, wherein the second isolation material encapsulates a pocket of trapped air or gas.

17. A structure comprising:
a semiconductor substrate having a surface;
first trench isolation structures extending from the surface through a buried semiconductor layer to a lower portion of the semiconductor substrate;
a device in the semiconductor substrate positioned laterally between the first trench isolation structures, wherein the device includes a semiconductor-controlled rectifier including multiple wells including:
two first wells adjacent to the surface, extending to the buried semiconductor layer, and having a first type conductivity; and
a second well adjacent to the surface, extending to the buried semiconductor layer, positioned laterally between the first wells and having a second type conductivity; and
multiple isolation structures with the device and including:
second trench isolation structures in the first wells; and
dual-level isolation structures between the second well and the first well;
wherein each dual-level isolation structure has a first section extending into the semiconductor substrate from the surface to a first depth above the buried semiconductor layer and at least one second section extending through the first section and into the semiconductor substrate to a second depth greater than the first depth and above the buried semiconductor layer,
wherein junctions between the second well and the first wells extend from the dual-level isolation structures to the buried semiconductor layer, and
wherein each second trench isolation structure extends into the semiconductor substrate from the surface to the first depth.

18. The structure of claim 17,
wherein the device further includes:
adjacent to each first well, a first contact region with the first type conductivity and a second contact region with the second type conductivity; and
an additional contact region adjacent to the second well and having the second type conductivity,
wherein each second trench isolation structure is positioned laterally between the first contact region and the second contact region of a corresponding first well, and
wherein the additional contact region is positioned laterally between the dual-level isolation structures.

19. The structure of claim 17, wherein, within each of the dual-level isolation structures, the second section includes any of:
a single second section narrower than the first section;
multiple second sections each narrower than the first section; and
an upper portion extending through the first section and a lower portion below the first section and wider than the upper portion.

20. The structure of claim 17, wherein the first section includes first isolation material and the second section includes second isolation material.

* * * * *